Sept. 9, 1969 L. L. KLEINBERG 3,466,560

STABLE AMPLIFIER HAVING A STABLE QUIESCENT POINT

Filed Oct. 22, 1965

INVENTOR
Leonard L. Kleinberg

BY

ATTORNEYS 3,466,560

STABLE AMPLIFIER HAVING A STABLE QUIESCENT POINT

Leonard L. Kleinberg, Greenbelt, Md., assignor to the United States of America as represented by the Administrator of the National Aeronautics and Space Administration Filed Oct. 22, 1965, Ser. No. 502,750
Int. Cl. H03f 3/68
U.S. Cl. 330—30 1 Claim

ABSTRACT OF THE DISCLOSURE

An amplifier utilizing a novel feedback system providing both stability and high gain which is particularly adaptable for monolithic and thin film construction. The quiescent point of the amplifier circuit is maintained at a constant voltage level through the use of feedback from a differential amplifier which amplifies the DC difference between the amplifier output and a stable reference.

The invention described herein may be manufactured and used by or for the government of the United States of America for governmental purposes without the payment of any royalties thereon or therefor.

This invention relates to amplifier circuits and more particularly to stabilized high gain amplifier circuits.

Amplifiers in general are utilized in electronic circuitry to amplify either AC or DC signals. Conventional amplifier networks normally include a means to control the gain of the amplifier. This means may consist of a variable resistor connected in either a bias or feedback circuit. If the gain of the amplifier changes, due to the aging of components, for example, the operator may change the variable resistance setting and compensate for the change in gain. It will be appreciated that while this means for obtaining a stable amplifier gain is satisfactory in some environments it is unsatisfactory in others. For example, for ease of measurement, instrumentation amplifiers are used in electronic measurements circuits for amplifying a low level signal to a higher level. It will be similarly appreciated that an amplifier which is to be utilized in this environment for continuous measuring must have either a stabilized or a continuously observed gain. In other words, to eliminate the problem of frequent recalibration, the amplifier must have stable gain.

The gain of an amplifier, particularly a transistor amplifier, varies with the age of its components. Temperature rise in the amplifier due to the internal heat generation as well as changes in environment also affect the gain of an amplifier. These variations are important when the amplifier is utilized in a laboratory and are critically important when the amplifier is utilized with instrumentation located at a remote point as, for example, in a missile or spacecraft. In recent years there has been an increasing effort to measure the earth's environment by utilizing instrumented spacecraft such as orbiting satellites and sounding rockets. Many of the desired measurements are made by instruments whose outputs are at low signal levels. Instrumentation amplifiers are required, therefore, to amplify the output signal to a higher magnitude prior to transmission to receive stations located on the earth. It is in situations of this type that the invention finds particular utility, but it will be appreciated that laboratories and satellites are only two examples of where a stable gain amplifier is useful. Other uses, for example, include instrumentation or relay amplifier networks utilized under the sea or at remote locations on the earth's surface.

Prior art apparatus for obtaining stabilized amplification has included electronically controlled servo systems to vary the control resistance of the amplifier, similar to manual control, to compensate for gain drift. However, this approach requires the use of complicated and comparatively bulky apparatus.

Other previously developed amplifiers have attempted to resolve the foregoing problems by electronically providing multiple stage amplifier systems having feedback to improve the stability thereof. However, in many cases this feedback has introduced resistance or reactance in the feedback loop which limits the degree of drift compensation that can be obtained. Further, to obtain a high closed loop gain, prior art feedback amplifiers require a very high open loop gain. High open loop gain is difficult to achieve, particularly with DC coupled amplifiers. In addition high gain requires high resistance, the value of which becomes increasingly prohibitive.

Still others have a relatively fixed emitter to base bias in a compensation transistor, however, this prevents operation of the amplifier in a high impedance mode. The problem has also been approached by carefully choosing components to obtain drift compensation as the components age. All of these devices require highly stable components that are too delicate, requiring frequent replacement.

It is an object of the invention to provide an improved stabilized high gain amplifier.

It is a further object of the invention to provide a more simple stabilized high gain amplifier.

It is a still further object of the invention to provide an improved signal amplifier network which utilizes transistors to furnish a highly stable output signal which is unaltered by the aging of components and is generally free of dependence on the careful choice of the network's electronic components.

The foregoing and other objects are accomplished by the provision of a unique feedback amplifier network. Specifically, in accordance with a principle of the invention the signal to be amplified is first applied to a conventional amplifier circuit. The output from the standard amplifier is then fed into one of the inputs of a differential amplifier while the second input to the differential amplifier is provided by a stable voltage source; and finally an output from the differential amplifier is fed back to bias the input of the conventional amplifier stage. This simple electronic network provides a signal amplification apparatus which has high gain as well as a stable output signal. Further, the system is easily controlled since the input from the stable power source can be selectively varied to provide a desired variation in the amplification of the system. Similarly, a selective variation of the supply voltages on the system's amplification elements also results in a variation in the gain of the amplifier. It will therefore be appreciated that in addition to its other features, another advantage of the invention is its ease of control. Still another advantage is that the feedback bias can vary over a wide dynamic range and still accomplish the purpose of the invention.

It will be appreciated that, due to the feedback bias mode of operation, the invention has the additional advantage of being susceptible to micro circuit construction.

The foregoing objects and many of the attendant advantages of the invention will become more readily appreciated as the same becomes better understood by reference to the following detailed description taken in conjunction with the accompanying drawing wherein.

Figure 1:
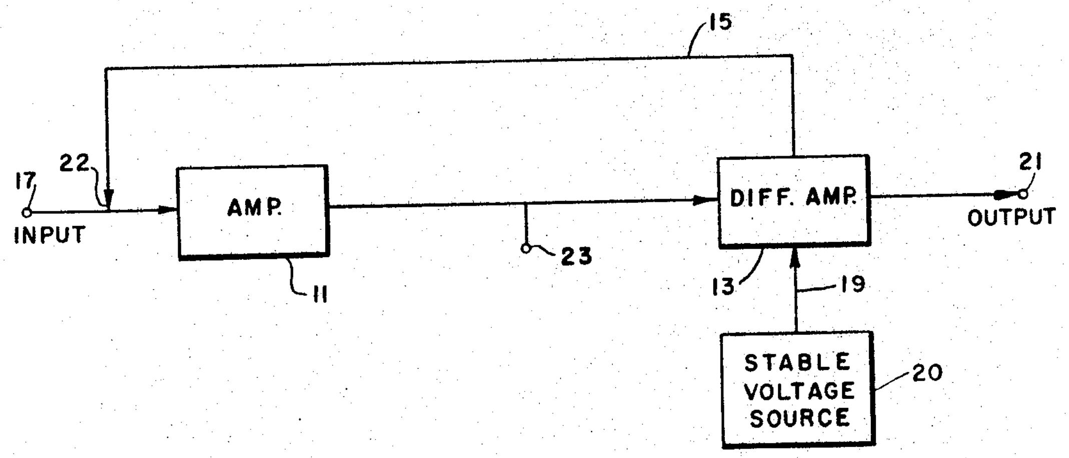
FIG. 1 is a block diagram of the overall system of the present invention.

FIG. 1 discloses generally a first amplifier stage 11, a differential amplifier stage 13, and a feedback bias connection 15. The input to the first amplifier's stage 11 is connected to an input terminal 17. The output from the first amplifier stage 11 is connected to one input of the differential amplifier 13. The differential amplifier has a second input 19 adapted for connection to a stable source of electric power 20. The output from the differential amplifier 13 is connected to a first output terminal 21. Also connected to the differential amplifier 13 is the feedback bias connection 15 which is connected to the input of the first amplifier at 22. In addition, a second output terminal 23 is connected directly to the output from the first stage amplifier 11. This second output terminal 23 provides an output which is more stable, but of lower gain than the output from the first output terminal 21 as hereinafter described.

The circuit illustrated in FIG. 1 will operate upon the application of an input signal to the input terminal 17. This signal is amplified by the first amplifier stage 11 and applied to the differential amplifier 13 as one of its inputs. The differential amplifier amplifies the DC difference between the input signals from the amplifier stage 11 and the stable source 20. As hereinafter described, in one embodiment of the invention, the differential amplifier 13 has two outputs. One output is DC and is applied to the feedback bias connection 15 for stabilization. The second output is the amplified input signal and is applied to the first output terminal 21 for further application to additional electronic circuitry as desired by a network utilizing the herein described system.

As understood, the system operates on the principle that an amplifier will maintain stability if the DC operating point of the system is maintained stable. The invention performs this function by utilizing the differential amplifier to sense a shift in this operating or quiescent point and provide a DC feedback to compensate for the shift. This feedback varies the bias on the input to maintain the amplifier at the quiescent point. Consequently, when the output is taken from the first stage amplifier 11 it is extremely stable over a wide range of variation in circuit components due to temperature, aging or other factors. When the output is taken from the differential amplifier the stability is not as good due to the variation in parameters of the elements included in the differential amplifier. However, due to the second stage of amplification, the gain is increased. Consequently although both outputs have high gain and stability, the one has a higher gain while the other has superior stability. It will be appreciated, therefore, that the foregoing network provides a simple amplifier that is stable over a wide range of system variations due to the utilization of a differential amplifier in conjunction with a stable voltage source to maintain stabilization.

Figure 2:
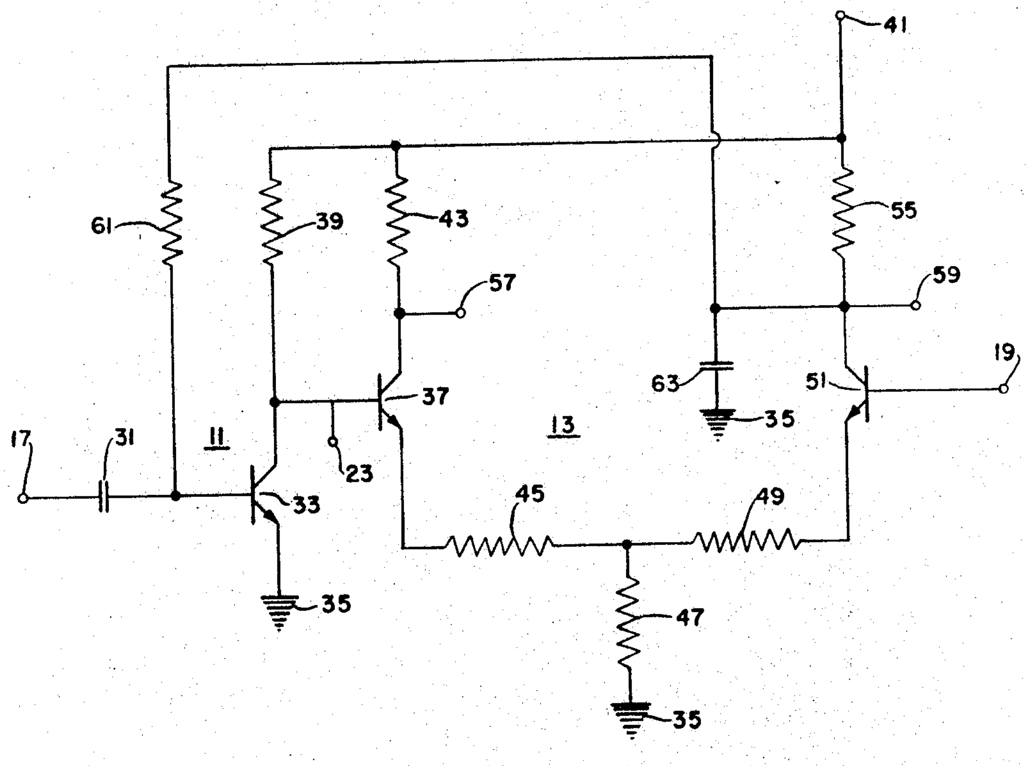
FIG. 2 is a schematic diagram of an electronic network in accordance with the invention.

FIG. 2 illustrates a schematic diagram of a circuit which operates in accordance with the present invention. The input signal is applied to the input terminal 17 and coupled through a capacitor 31 to a first transistor 33 which preferably has a high current amplification factor of over 100. The emitter of the first transistor is connected to ground 35. Hence, this first transistor constitutes a grounded emitter amplifier stage. The output from the first transistor is taken from its collector and applied to the base of a second transistor 37. The collector of the first transistor is connected through a resistor 39 to a supply source 41. The collector of the second transistor is also connected through a resistor 43 to the supply source 41. The emitter of the second transistor 37 is connected through a pair of resistors 45 and 47, connected in series, to ground 35. The interconnection between the last two described resistors 45 and 47 is connected through a further resistor 49 to the emitter of a third transistor 51. The base of the third transistor 51 is connected to the input terminal 19 adapted for connection to the stable voltage source 20 (FIG. 1). The collector of the third transistor 51 is connected through still another resistor 55 to the supply source 41.

The second and third transistors 37 and 51 in the above described configuration correspond to the differential amplifier 13 described in connection with FIG. 1. The output from the differential may be taken at the collector of the second transistor 37 at a terminal 57, or at the collector of the third transistor 51 at a terminal 59. FIG. 2 illustrates one output 59 being taken at the collector of the third transistor 51 and fed back through a feedback resistor 61 to the base of the first transistor 33. To provide an AC by-pass this feedback output is coupled through a capacitor 63 to ground 35.

In accordance with the invention the circuit illustrated in FIG. 2 operates by amplifying the signal applied at the input terminal 17 of the first stage 11 which comprises the first transistor 33 in the grounded emitter configuration. The output taken from the collector of the first transistor 33 is applied as one input to the differential amplifier 13. The third transistor has its base connected to a stable source of voltage at terminal 19. The differential amplifier amplifies the DC difference between the two input signals and generates an output at the collector of the third transistor 59, which is fed back through the feedback resistor 61 to stabilize the input to the overall network. As stated above the differential amplifier senses changes in the quiescent point of the first stage of amplification and through the feedback arrangement varies the input bias to maintain the first stage at said operating point. Hence, the foregoing described system is an electronically simple feedback amplifier which is stable over a wide range of variations in circuit components due to aging, environmental or other causes.

As set forth above the outputs for application to other systems can be obtained at various points, if a highly stable output is desired it can be obtained from the collector of the first transistor 33. If somewhat lower stability but increased gain is desired the output can be taken from the collector of the second transistor 37.

In the preferred embodiment of the invention the first amplification stage constitutes a transistor having a high beta (the current amplification factor of the transistor) however, any transistor having a beta value over about 100 will operate in a satisfactory manner.

To more fully understand the overall concept of the invention the following mathematical analysis of the embodiment of the invention illustrated in FIG. 2 is presented wherein:

$K_v$=voltage amplification of the first transistor 33 at the second output terminal 23;
$R_1$=load on the first transistor 33;
$r_e$=emitter resistance of the first transistor 33;
$i_c$=collector current of the first transistor;
$E_c$=value of the supply voltage 41;
$e_c$=voltage on the collector of the first transistor at its quiescent operating point; and $$F=\frac{E_c-e_c}{E_c}$$

where F is a constant determined by the values of $E_c$ and $e_c$.

For a high beta transistor:

$$K_v \approx \frac{R_1}{r_e} \qquad (1)$$

also, $$r_e \approx \frac{1}{39 i_c} \qquad (2)$$

and, $$i_c = \frac{E_c F}{R_1} \qquad (3)$$

therefore, $$r_e \approx \frac{R_1}{39 E_c F} \qquad (4)$$

and $$K_v \approx 39FE_c \quad (5)$$

Equation 5 shows that the voltage gain of the first transistor 33 is independent of load resistance and depends upon the quiescent and supply voltages. If the quiescent voltage is maintained constant the gain will be stable regardless of any change in the load resistance. This function is performed by the differential amplifier and its feedback bias connection as hereindescribed.

Further the amplification at the output at the collector of the second transistor 37 is represented by approximately $$39FE_c\left(\frac{R_{43}}{R_{45}+R_{49}}\right)$$

Where $R_{43}$ equals the value of the resistance 43 between the collector of the second transistor 37 and the supply source 41; and $R_{45}+R_{49}$ equals the value of the resistance 45 and 49 between the emitters of the second and third transistors 37 and 51. In this case, the amplification of the signal is increased. However, as stated above, the stability is decreased due to the amplification now depending on the additional resistance factors.

The foregoing has been a brief mathematical analysis of the invention to illustrate how the invention meets the objects of the invention and provides a stable high gain amplifier. Although the analysis has been applied to the circuit illustrated in FIG. 2, a similar analysis can be performed for other specific circuits meeting the broader concept of the invention as illustrated in FIG. 1.

It will be appreciated that the foregoing detailed description sets forth an embodiment of the invention which mets all of the foregoing objects and provides a simple, stable high gain amplifier. However, it should be understood that the invention may be practiced otherwise than as specifically herein disclosed. For example, the principle of the invention has been disclosed with a grounded emitter amplifier, however, a grounded base amplifier falls within the scope of the invention. Similarly, a voltage divider can be coupled to the supply source to provide the stable source rather than an external source. Consequently, it is to be understood that, within the scope of the appended claim, the invention may be practiced otherwise than as specifically described.

What is claimed is:

1. In a stabilized high gain amplifier network consisting of resistors, capacitors and semiconductive devices, the improvement comprising:

an input terminal;

a supply power source;

a first high beta transistor, the base of said first transistor connected to said input terminal;

the collector of said first transistor connected to said supply power source;

a second transistor;

the base of second transistor connected to the collector of said first transistor; the collector of said second transistor connected to said supply power source; a third transistor; the base of said third transistor adapted for connection to a stable source of electronic signals; the collector of said third transistor connected to said supply power source; a first resistor; a second resistor; said first and second resistors connected in the series between the emitters of said second and third transistors; a third resistor; said third resistor connected between the junction of said first and second resistors and the emitter of said first resistor; a fourth resistor; said fourth resistor connected between the collector of said third transistor and the base of said first transistor; a pair of output terminals connected to the collector of said first transistor.

References Cited

UNITED STATES PATENTS 3,304,512 2/1967 McMillan ---------- 330—26 X

ROY LAKE, Primary Examiner

L. J. DAHL, Assistant Examiner

U.S. Cl. X.R.

330—26